(12) United States Patent
Yoon et al.

(10) Patent No.: US 12,374,409 B2
(45) Date of Patent: Jul. 29, 2025

(54) METHOD AND APPARATUS WITH FLASH MEMORY CONTROL

(71) Applicant: SAMSUNG ELECTRONICS CO., LTD., Suwon-si (KR)

(72) Inventors: Daekun Yoon, Suwon-si (KR); Seok Ju Yun, Hwaseong-si (KR); Sang Joon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 194 days.

(21) Appl. No.: 17/863,556

(22) Filed: Jul. 13, 2022

(65) Prior Publication Data

US 2023/0298675 A1 Sep. 21, 2023

(30) Foreign Application Priority Data

Jan. 25, 2022 (KR) .......................... 10-2022-0010736

(51) Int. Cl.
  *G11C 16/10* (2006.01)
  *G06F 7/544* (2006.01)
  *G11C 11/54* (2006.01)
  *G11C 16/34* (2006.01)
  *G11C 16/30* (2006.01)

(52) U.S. Cl.
  CPC ........ *G11C 16/3404* (2013.01); *G06F 7/5443* (2013.01); *G11C 11/54* (2013.01); *G11C 16/10* (2013.01); *G11C 16/3459* (2013.01); *G11C 16/3481* (2013.01); *G11C 16/30* (2013.01)

(58) Field of Classification Search
  CPC ..... G11C 16/3404; G11C 11/54; G11C 16/10; G11C 16/3459; G11C 16/3481; G06F 7/5443
  See application file for complete search history.

(56) References Cited

U.S. PATENT DOCUMENTS

| 7,130,210 B2 | 10/2006 | Bathul et al. | |
| 2005/0162924 A1* | 7/2005 | Guterman | G11C 16/3481 365/185.28 |

(Continued)

FOREIGN PATENT DOCUMENTS

| KR | 10-2001-0098827 A | 11/2001 |
| KR | 10-2007-0002411 A | 1/2007 |

(Continued)

OTHER PUBLICATIONS

Extended European search report issued on May 24, 2023, in counterpart European Patent Application No. 22207759.6 (8 pages in English).

*Primary Examiner* — Mushfique Siddique
(74) *Attorney, Agent, or Firm* — NSIP Law (57) ABSTRACT

A method and apparatus with flash memory control are provided. The method includes performing first programming on a target memory cell of a cell array while adjusting a first programming time and a programming voltage, when a cell current of the target memory cell is determined to satisfy a primary target in association with the first programming, performing second programming on the target memory cell while adjusting a second programming time, and when the cell current of the target memory cell is determined to satisfy a secondary target in association with the second programming, terminating programming on the target memory cell.

21 Claims, 9 Drawing Sheets

(56) References Cited

U.S. PATENT DOCUMENTS

| | | | | |
|---|---|---|---|---|
| 2009/0273981 | A1* | 11/2009 | Moschiano | G11C 16/10 365/185.19 |
| 2019/0164617 | A1* | 5/2019 | Tran | G11C 11/54 |
| 2021/0264983 | A1 | 8/2021 | Lemke et al. | |
| 2021/0358551 | A1* | 11/2021 | Tran | G11C 16/10 |
| 2022/0165337 | A1* | 5/2022 | Bhatia | H03M 13/611 |

FOREIGN PATENT DOCUMENTS

| | | |
|---|---|---|
| KR | 10-2008-0029561 A | 4/2008 |
| KR | 10-0858745 B1 | 9/2008 |
| KR | 10-0861422 B1 | 10/2008 |
| KR | 10-0953063 B | 4/2010 |
| KR | 10-0960479 B1 | 6/2010 |
| KR | 10-2011-0075312 A | 7/2011 |
| KR | 10-2020-0060739 A | 6/2020 |
| KR | 10-2125376 B1 | 6/2020 |

\* cited by examiner

METHOD AND APPARATUS WITH FLASH MEMORY CONTROL

CROSS-REFERENCE TO RELATED APPLICATIONS

This application claims the benefit under 35 USC § 119(a) of Korean Patent Application No. 10-2022-0010736, filed on Jan. 25, 2022, in the Korean Intellectual Property Office, the entire disclosure of which is incorporated herein by reference for all purposes.

BACKGROUND

1. Field

The following description relates to a method and apparatus with flash memory control.

2. Description of Related Art

Flash memory is a form of non-volatile memory that retains stored data without needing power. Flash memory may store data by adjusting the quantity of electrons present in a charge trapping layer of a memory cell. The memory cell may be a single-level cell (SLC), a multi-level cell (MLC), or a triple-level cell (TLC), which correspond with amounts of storable data.

The speed of a matrix-vector multiplication operation, or a multiply-accumulate (MAC) operation, may affect the performance of applications in various fields. For example, a MAC operation may be performed for machine learning and for authentication of a neural network that includes multiple layers. The MAC operation is iterated for a plurality of layers, and thus, the performance of neural network processing may depend on the performance of MAC operation processing. A structural feature of flash memory may be used to perform the MAC operation, and when performance of the flash memory is increased, the speed of the MAC operation may be significantly increased.

SUMMARY

In one general aspect, a method includes performing first programming on a target memory cell of a cell array while adjusting a first programming time and a programming voltage, when a cell current of the target memory cell is determined to satisfy a primary target in association with the first programming, performing second programming on the target memory cell while adjusting a second programming time, and when the cell current of the target memory cell is determined to satisfy a secondary target in association with the second programming, terminating programming on the target memory cell.

The performing of the first programming may include, when the cell current of the target memory cell may be determined to not satisfy the primary target when the first programming time has reached a threshold value, performing the first programming while increasing the programming voltage.

The cell current of the target memory cell may vary more when adjusting the programming voltage than when adjusting the first programming time.

The performing of the first programming may include determining a variation of the cell current of the target memory cell based on the first programming, when the variation of the cell current is determined to be greater than an upper limit of a primary target range, decreasing the first programming time, and when the variation of the cell current is determined to be less than a lower limit of the primary target range, increasing the first programming time or the programming voltage.

The increasing of the first programming time or the programming voltage may include, when the first programming time is determined to correspond to a maximum value, increasing the programming voltage.

The performing of the second programming may include determining a variation of the cell current of the target memory cell based on the first programming and the second programming, when the variation of the cell current is determined to be greater than an upper limit of a secondary target range, decreasing the second programming time, and when the variation of the cell current is determined to be less than a lower limit of the secondary target range, increasing the second programming time.

A range of the primary target may be greater than a range of the secondary target.

At least a portion of the primary target and a portion of the secondary target may be set based on a network parameter of a neural network model, and a network operation of the neural network model may be performed using the target memory cell.

The network operation may include a multiply-accumulate (MAC) operation.

In one general aspect, one or more embodiments includes a non-transitory computer-readable storage medium storing instructions that, when executed by a processor, cause the processor to perform any one, any combination, or all operations and/or methods described herein.

In one general aspect, a device includes a cell array including a plurality of memory cells, and a controller configured to perform first programming on a target memory cell of the cell array while adjusting a first programming time and a programming voltage based on a determined cell current of the target memory cell, wherein when the cell current of the target memory cell is determined to satisfy a primary target in association with the first programming, the controller performs second programming on the target memory cell while adjusting second programming time, and when the cell current of the target memory cell is determined to satisfy a secondary target in association with the second programming, terminate programming on the target memory cell.

The controller may be further configured to, when the cell current of the target memory cell is determined to not satisfy the primary target and the first programming time is determined to have reached a maximum value, perform the first programming while increasing the programming voltage.

The cell current of the target memory cell may vary more when adjusting the programming voltage rather than when adjusting the first programming time.

The controller may be configured to determine a variation of the cell current of the target memory cell based on the first programming, when the variation of the cell current is determined to be greater than an upper limit of a primary target range, decrease the first programming time, and when the variation of the cell current is determined to be less than a lower limit of the primary target range, increase the first programming time or the programming voltage.

The controller may be configured to, when the first programming time corresponds to a maximum value, increase the programming voltage.

The controller may be configured to determine a variation of the cell current of the target memory cell based on the first programming and the second programming, when the variation of the cell current is determined to be greater than an upper limit of a secondary target range, decrease the second programming time, and when the variation of the cell current is determined to be less than a lower limit of the secondary target range, increase the second programming time.

At least a portion of the primary target and a portion of the secondary target may be set based on a network parameter of a neural network model, a network operation of the neural network model may be performed using the target memory cell, and the network operation may include a multiply-accumulate (MAC) operation.

The device may be a smart phone.

In one general aspect, an electronic apparatus includes a flash memory including a plurality of memory cells, and a processor configured to perform first programming on a target memory cell of the flash memory while adjusting a first programming time and a programming voltage, when a cell current of the target memory cell is determined to satisfy a primary target in association with the first programming, perform second programming on the target memory cell while adjusting a second programming time, and when the cell current of the target memory cell is determined to satisfy a secondary target after the second programming, terminate programming on the target memory cell.

During the second programming, the second programming time may change in smaller increments than the second programming does during the first programming.

The processor may be further configured to, when the cell current of the target memory cell is determined to not satisfy the primary target and when the first programming time is determined to have reached a maximum value, perform the first programming while increasing the first programming voltage.

The processor may be further configured to determine a variation of the cell current of the target memory cell based on the first programming, when the variation of the cell current is determined to be greater than an upper limit of a primary target range, decrease the first programming time, when the variation of the cell current is determined to be less than a lower limit of the primary target range, increase the first programming time or the programming voltage, and when the first programming time is determined to correspond to a maximum value, increase the programming voltage.

In one general aspect, a method includes repeatedly adjusting a programming voltage of a memory cell of a flash memory device until it is determined that a cell current of the memory cell has reached a first threshold, and, based on determining that the cell current has reached the first threshold, repeatedly adjusting a programming time of the memory cell until it is determined that the cell current of the memory cell has reached a second threshold.

The repeatedly adjusting of the programming voltage may further include adjusting the programming time of the programming voltage.

The programming time may be adjusted with greater granularity before determining that the cell current has reached the first threshold than when adjusted after determining that the cell current has reached the first threshold.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms "a", "an", and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms used herein including technical or scientific terms have the same meanings as those generally understood consistent with and after an understanding of the present disclosure. Terms, such as those defined in commonly used dictionaries, should be construed to have meanings matching with contextual meanings in the relevant art and the present disclosure, and are not to be construed as an ideal or excessively formal meaning unless otherwise defined herein. Use of the term "may" herein with respect to an example or embodiment, e.g., as to what an example or embodiment may include or implement, means that at least one example or embodiment exists where such a feature is included or implemented, while all examples are not limited thereto.

Hereinafter, examples will be described in detail with reference to the accompanying drawings. When describing the examples with reference to the accompanying drawings, like reference numerals refer to like components and a repeated description related thereto will be omitted.

Figure 1:
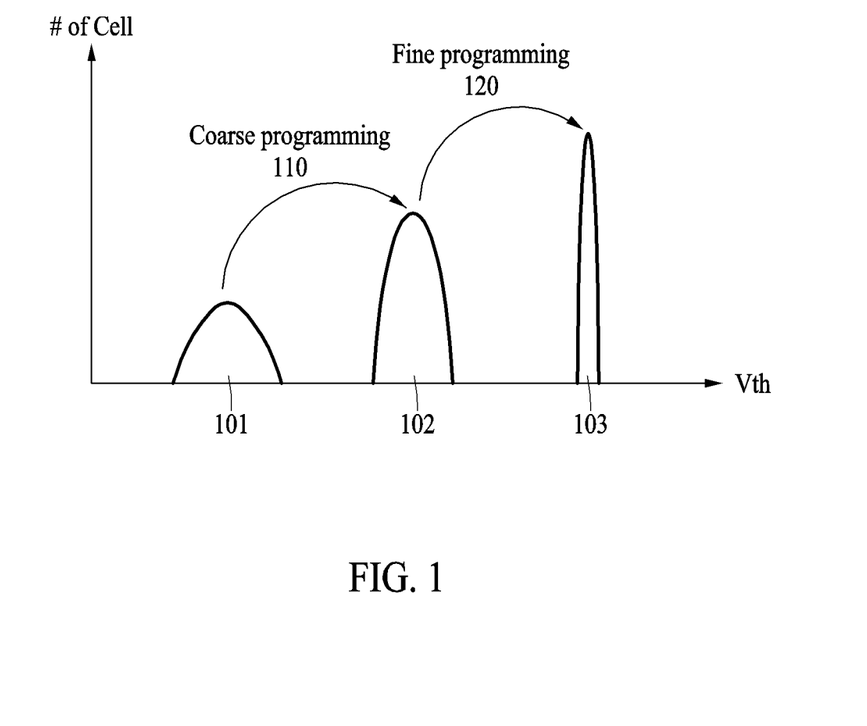
FIG. 1 illustrates example distributions of cell threshold voltages resulting from stepwise programming using multiple factors, according to one or more embodiments.

FIG. 1 illustrates example distributions of cell threshold voltages resulting from stepwise programming using multiple factors, according to one or more embodiments. Referring to FIG. 1, electrons may be trapped, to varying degrees, in charge trapping layers of memory cells of a flash memory device by programming operations (e.g., an incremental step-pulse programming discussed below). For example, coarse programming 110 and fine programming 120 may be used. Threshold voltage values of the memory cells may have different dispersions (which may appear gaussian due to randomization). For example, first, second, and third dispersions 101, 102, and 103 correspond to quantities of trapped electrons. Here, a threshold voltage may correspond to a gate threshold voltage. The first dispersion 101 may correspond to an erase state. Electrons may escape from a charge trapping layer in the erase state, and thus, the cells in the first dispersion 101 may have comparatively small threshold voltage values. In programming operations, for example the coarse programming 110 and the fine programming 120, the threshold voltage values of the cells may increase and may be dispersed as shown by the second and third dispersions 102 and 103.

The first, second, and third dispersions 101, 102, and 103 may each correspond to certain data values, respectively. The threshold voltage values in a same dispersion (whether the first, second, or third dispersion 101, 102, and 103) may represent the same data value, just as the threshold voltage values in another of the dispersions may represent another data value. When voltage for a read operation is applied to a memory cell, a cell current value of the memory cell may be determined depending on the threshold voltage value of that memory cell. Therefore, a data value of the memory cell may be determined by reading the current value of that memory cell. Here, a cell current may correspond to a drain current.

An operation feature of various memories, including an operation feature of a flash memory, may be used to perform a mathematical operation with laws of physics, such as Ohm's law and Kirchhoff's law. Such an operation method may be referred to as in-memory computing. For in-memory computing using a flash memory, threshold voltages may benefit from having a narrow threshold voltage dispersal feature. In other words, a narrow threshold dispersal feature is one where the threshold voltages are densely dispersed in a narrow range. For example, the third dispersion 103 may have a narrower feature than the second dispersion 102. Conversely, the second dispersion 102 may have a wide dispersal feature. A narrow dispersal feature may increase operation accuracy. For example, for a given dispersion, when reading data values through cell currents, a wide dispersal feature may correspond to a decreased consistency of cell currents representing a certain data value for the given dispersion. Such a decrease of consistency may accumulate as an operation is repeated and may thus decrease accuracy of the operation.

Programming operations, for example, the coarse programming 110 and the fine programming 120, may provide a narrow dispersion, such as the third dispersion 103. Programming operations, for example, the coarse programming 110 and the fine programming 120, may be performed stepwise and may be based on multiple factors that may affect resulting threshold voltages, in various embodiments. Such multiple factors may include programming time and/or programming voltage. The programming voltage may correspond to a source line (SL) voltage. The programming voltage may generate a relatively large change in a programming state of a memory cell, and the programming time may generate a relatively slight change in the programming state of the memory cell. The programming state determined by the aforementioned factors may correspond to a quantity of electrons trapped in a charge trapping layer of a memory cell. The programming state may affect a threshold voltage and a cell current. That is, the threshold voltage and cell current of cells varies with their quantities of electrons. Specifically, the cell current may generally be proportional to a square of the threshold voltage, and thus, more elaborate and precise control may be helpful when controlling the threshold voltage. The cell current may be set toward a target value (within a small margin) through multi factor-based stepwise programming operations, for example, the coarse programming 110 and the fine programming 120.

In an example, a flash memory device may perform the coarse programming 110 on a target memory cell by adjusting a coarse programming time and a coarse programming voltage. The coarse programming time and the coarse programming voltage may refer, respectively, to programming time and programming voltage used in the coarse programming 110. When a cell current of a target memory cell reaches a value that satisfies a primary target during the coarse programming 110, the flash memory device may then begin performing the fine programming 120 on the target memory cell while adjusting the fine programming time. The fine programming time may refer to programming time used in the fine programming 120. When the cell current of the target memory cell reaches a value that satisfies a secondary target during the fine programming 120, the flash memory device may terminate programming on the target memory cell.

In this example, the programming voltage may only be adjusted in the coarse programming 110, however, there may be examples of adjusting the programming voltage during the fine programming 120. In addition, although this example includes two programming operations, for example, the coarse programming 110 and the fine programming 120, there may be examples of three or more programming operations. In these cases, several initial programming operations may be coarse programming, and the rest of the programming operations may be fine programming.

Figure 2:
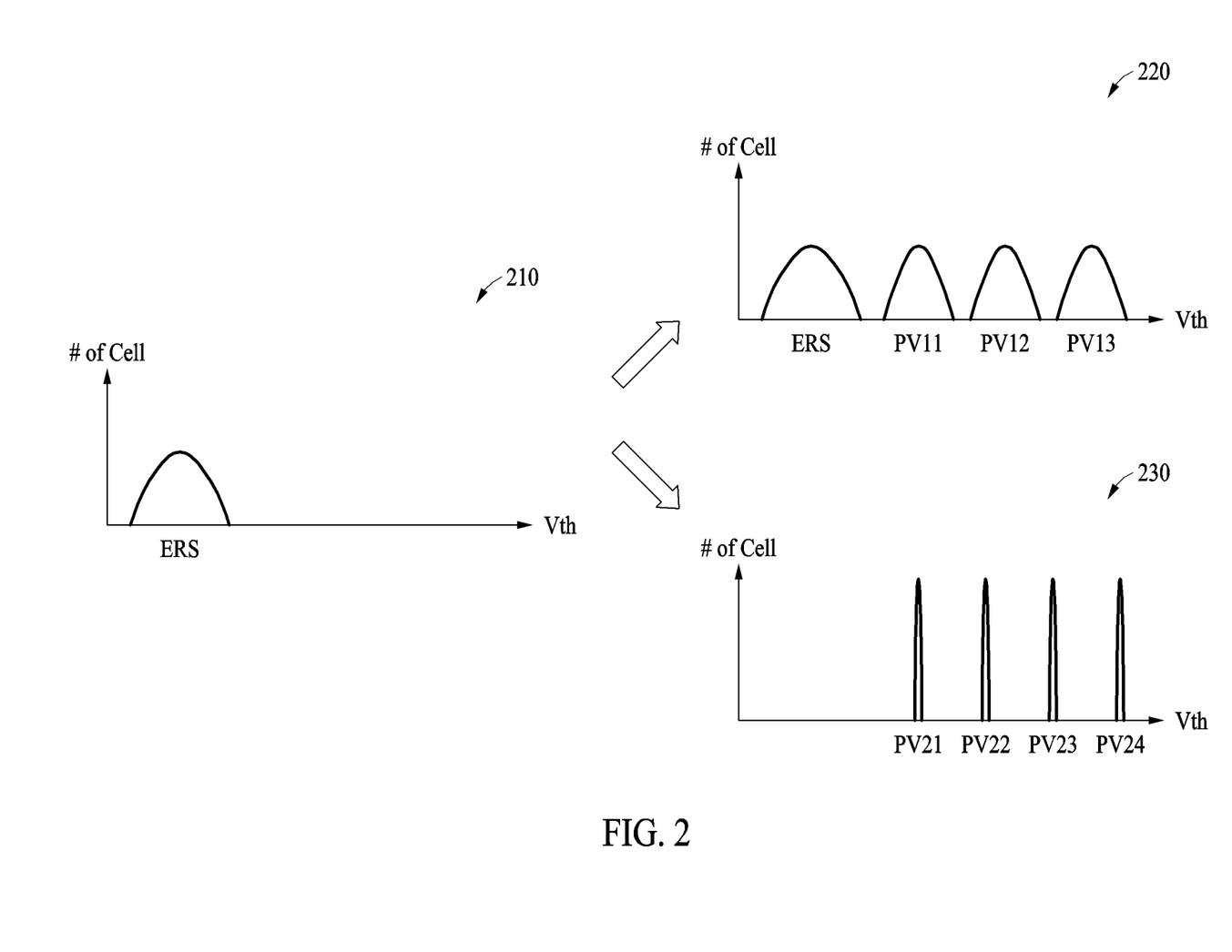
FIG. 2 illustrates an example of a dispersal feature of programming results, according to one or more embodiments.

FIG. 2 illustrates an example of a dispersal feature of programming results, according to one or more embodiments. Referring to FIG. 2, a first graph 210 may represent a dispersion of threshold voltage values before programming memory cells, and second and third graphs 220, 230 may represent dispersions of threshold voltage values after programming the memory cells. For example, the second graph 220 may correspond to a result of typical incremental step pulse programming (ISPP) that does not use multiple factors, and the third graph 230 may correspond to a result of stepwise programming using multiple factors. Dispersions ERS, PV11, PV12, and PV13 in the second graph 220 may have a wide dispersal feature and dispersions PV21, PV22, PV23, and PV24 may have a narrow dispersal feature.

Figure 3:
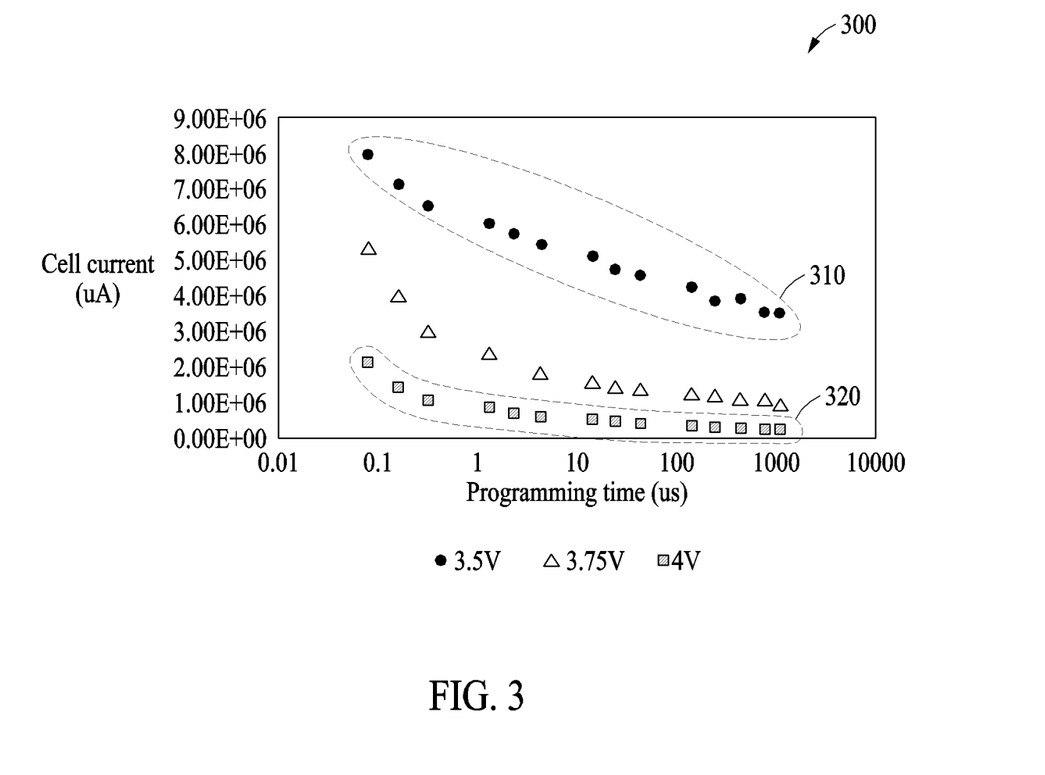
FIG. 3 illustrates an example of an impact of multiple factors on a cell current. according to one or more embodiments.

FIG. 3 illustrates an example of an impact of multiple factors on a cell current, according to one or more embodiments. The multiple factors may include programming time and programming voltage. Referring to the graph 300 shown in FIG. 3, when incrementally increasing the programming time while the programming voltage is constant, the cell current may decrease to a certain level but then no longer decrease below a certain level. In this case, the cell current may then be decreased to below the certain level by incrementally increasing the programming voltage. When incrementally increasing both the programming time and the programming voltage, the cell current may be decreased even further below the certain level.

For example, a first region 310 is an example of using a programming voltage of 3.5 volts (V). Referring to the first region 310, the cell current may be precisely controlled by increasing the programming time while using the programming voltage of 3.5 V, but with the programming voltage being fixed at 3.5 V, the cell current may not decrease below 3 microamperes (μA) even if the programming time continues to be increased. A second region 320 is an example of using a programming voltage of 4.5 V. Referring to the second region 320, when using the programming voltage of 4.5 V, the cell current may be decreased to nearly 0 μA, but with a very short programming time, it may be decreased to below 3 μA. In this case, an appropriate combination of multiple factors may be used to precisely control the cell current.

Figure 4:
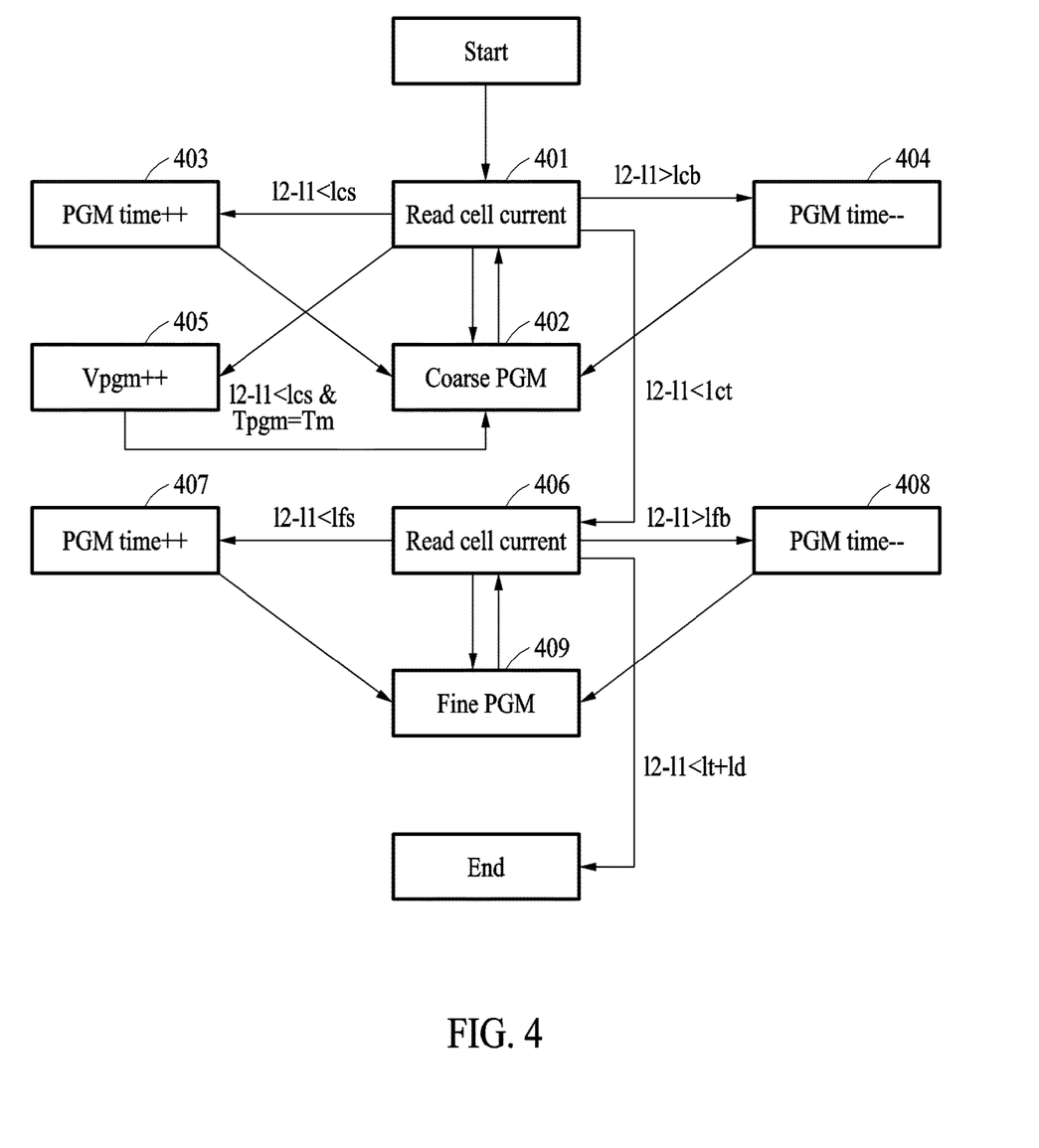
FIG. 4 illustrates an example of stepwise programming, according to one or more embodiments.

FIG. 4 illustrates an example of stepwise programming, according to one or more embodiments. Referring to FIG. 4, in operation 401, a flash memory device may read a cell current of a memory cell. A cell current value 11 may be a value read before coarse programming, and a cell current value 12 may be a value read after the coarse programming. The cell current value 11 may initially be a value corresponding to an erase state of the memory cell. In operation 402, the flash memory device may perform coarse programming. The flash memory device may perform coarse programming based on an initial value of coarse programming time and an initial value of coarse programming voltage. After the operation 402, in operation 401, the flash memory device may read the cell current value 12. The flash memory device may then determine a variation of the cell current based on the cell current value 11 and the cell current value 12. For example, the cell current variation may be a difference between the cell current value 12 and the cell current value 11.

The flash memory device may then compare the cell current variation with a target range of the coarse programming. The target range may be specified by an upper limit value Icb and a lower limit value Ics. When the cell current variation is determined to be less than the lower limit value Ics, then operation 403 may be performed and the flash memory device may increase a coarse programming time value. When the cell current variation is determined to be greater than the upper limit value Icb, then operation 404 may be performed, and the flash memory device may decrease a coarse programming time value. When the coarse programming time value is determined to already correspond to a maximum value Tm, even when the cell current variation is less than the upper limit value Ics, then operation 405 is performed and the flash memory device may increase the coarse programming voltage value.

When at least a portion of the coarse programming time and/or the coarse programming voltage is adjusted, in operation 402, the flash memory device may perform the coarse programming with the adjusted value of the coarse programming voltage. In operation 401, the flash memory device may read the cell current value 12. When the cell current is determined to satisfy a coarse programming target, the flash memory device may terminate the coarse programming and proceed with the fine programming. Operations 401 through 405 may correspond to the coarse programming, and operations 406 through 409 may correspond to the fine programming. In this example, the flash memory device may determine that the coarse programming target is satisfied when the cell current variation is determined to be less than a primary target value Ict. The primary target value Ict may be less than the upper limit value Icb of the target range and greater than the lower limit value Ics.

The flash memory device may compare the cell current variation with a target range of the fine programming. The coarse programming target may be referred to as a primary target, and the fine programming target may be referred to as a secondary target. A secondary target range may be specified by an upper limit value Ifb and a lower limit value Ifs. A primary target range may be greater than the secondary target range. The upper limit value Ifb of the secondary target range may be less than the upper limit value Ich of the primary target range, and the lower limit value Ifs of the secondary target range may be greater than the lower limit value Ics of the primary target range. In operations 407 and 408, the flash memory device may adjust a fine programming time. When the cell current variation is determined to be less than the lower limit value Ifs, then in operation 407, the flash memory device may increase a coarse programming time value, and when the cell current variation is determined to be greater than the upper limit value Ifb, then in operation 408, the flash memory device may decrease the coarse programming time value.

In operation 409, the flash memory device may perform the fine programming with an adjusted value. In operation 406, the flash memory device may read the cell current value 12. Both the coarse programming and the fine programming may be applied to the cell current value 12. When the cell current satisfies a fine programming target, the flash memory device may terminate programming on the target memory cell. For example, the flash memory device may determine that the fine programming target is satisfied when the cell current variation is less than the sum of a secondary target value It and a margin value Id. A secondary target value may be less than the upper limit value Ifb of the secondary target range and greater than the lower limit value Ifs. The flash memory device may designate another memory cell of a cell array as a next target memory cell and perform programming on the next target memory cell.

The example of FIG. 4 increases the programming voltage during the coarse programming in operation 405, but there may be examples in which the programming voltage may decrease in coarse programming or the programming voltage may increase/decrease in fine programming.

Figure 5A:
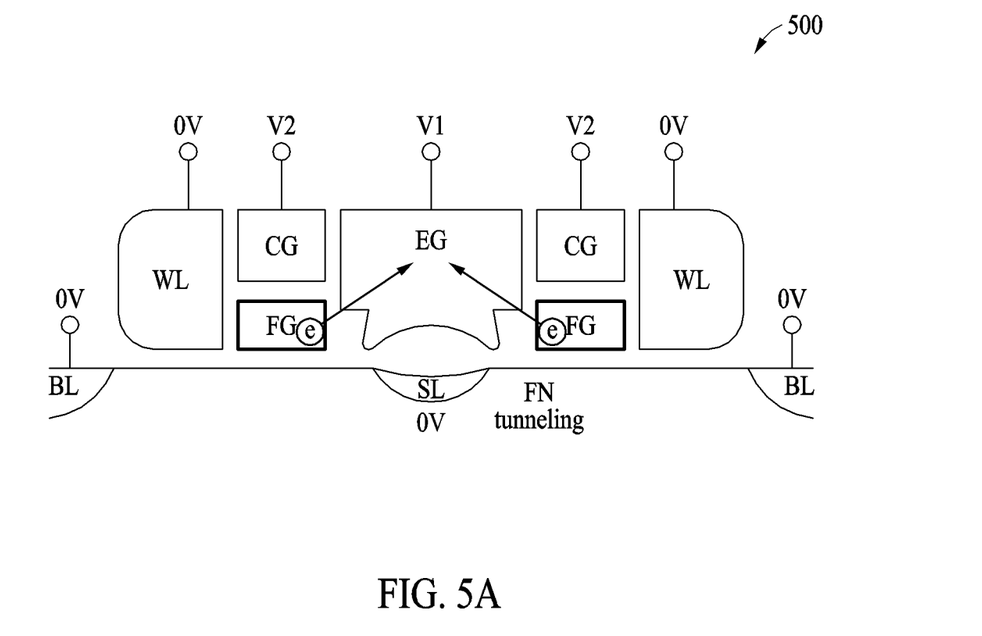
FIG. 5A illustrates an example of an impact of memory control on a memory cell, according to one or more embodiments.
Figure 5B:
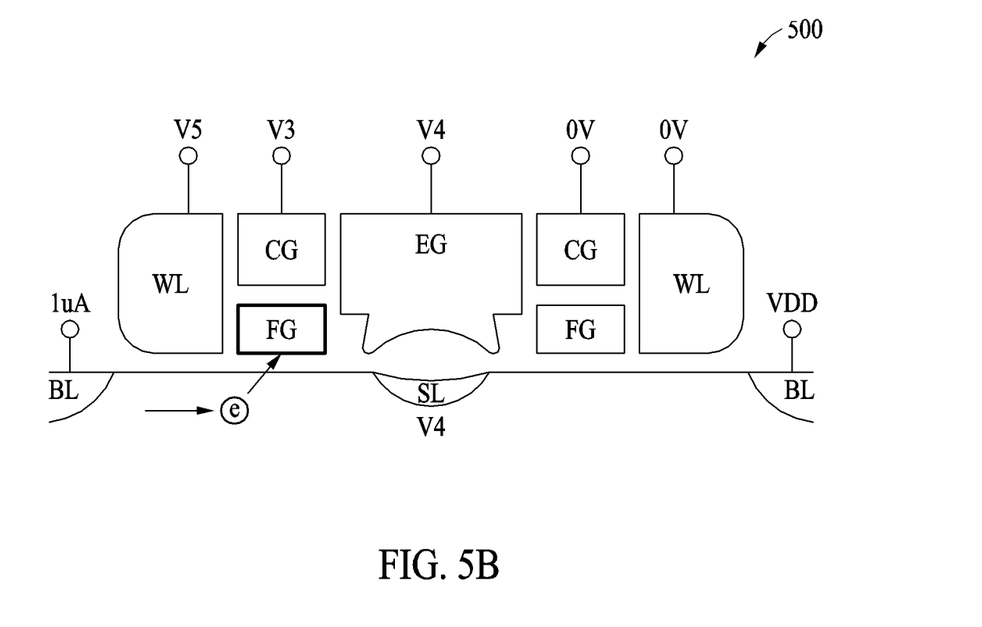
FIG. 5B illustrates an example of an impact of memory control on a memory cell, according to one or more embodiments.

FIGS. 5A and 5B illustrate examples of the impact of memory control on a memory cell. FIG. 5A illustrates an example of an erase operation performed on a memory cell 500, according to one or more embodiments. Referring to FIG. 5A, the memory cell 500 may include a charge gate (CG), a floating gate (FG), and an erase gate (EG). The FG may correspond to a charge trapping layer. The memory cell 500 may be controlled through a SL, a bit line (BL), and a word line (WL). When a certain voltage is applied to the CG and the EG for the erase operation, electrons in the FG may escape to the EG. For example, V1 may be 10.5 V, and V2 may be −8.7 V. A structure of the memory cell 500 and the erase operation illustrated in FIG. 5A are presented as examples. The memory cell 500 may have various structures for erase operations and may perform various erase operations suitable for the various structures.

FIG. 5B illustrates an example of a programming operation performed on the memory cell 500, according to one or more embodiments. Referring to FIG. 5B, when a certain voltage is applied to the CG, the EG, the SL, and the WL, electrons may be trapped in the FG. For example, V3 may be 10.5 V. V4 may be 4.3 V, and V5 may be 0.7 V. An SL voltage may correspond to programming voltage. The programming current and/or the programming voltage may be adjusted for stepwise programming (according to the coarse or fine programming techniques described herein) using multiple factors, and the memory cell 500 may be controlled based on the adjusted programming current and/or the adjusted programming voltage. The structure of the memory cell 500 and the programming operation illustrated in FIG. 5B are presented as examples. The memory cell 500 may have various structures for programming operations and may perform various programming operations suitable for the various structures.

Figure 6:
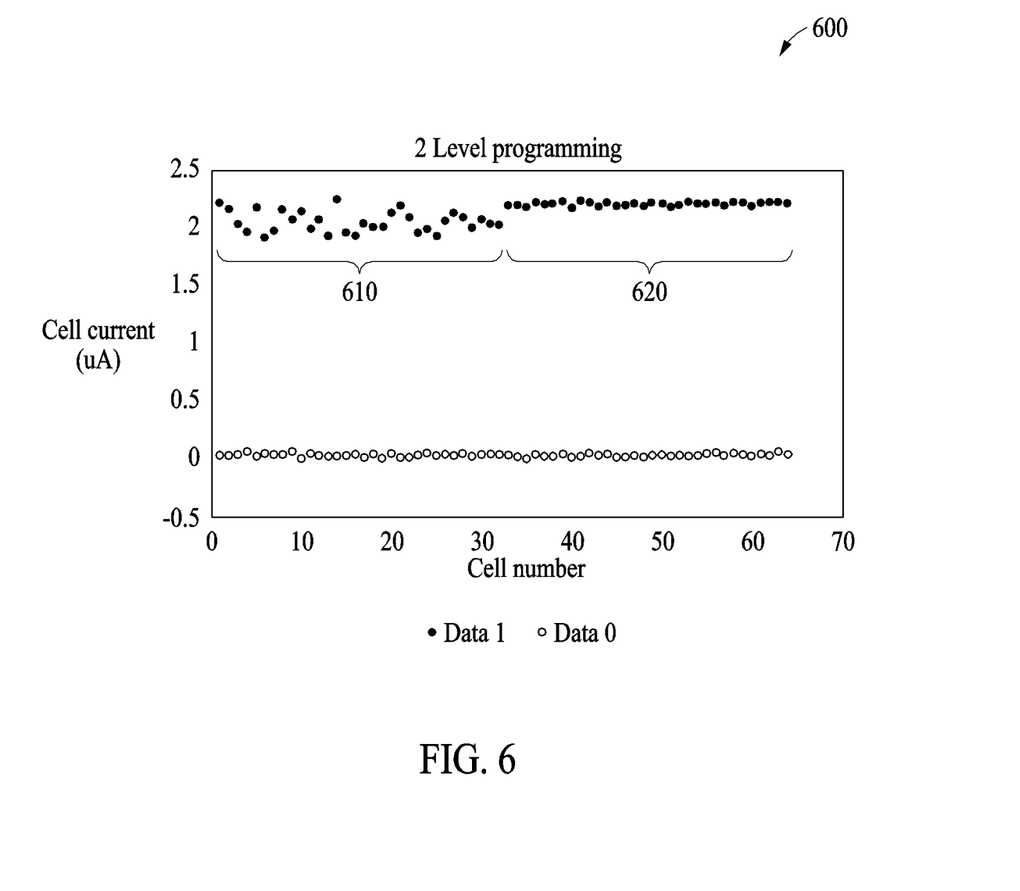
FIG. 6 illustrates an example of a dispersal feature in accordance with a programming method, according to one or more embodiments.

FIG. 6 illustrates an example of a dispersal feature in accordance with a programming method, according to one or more embodiments. The graph 600 shown in FIG. 6 illustrates an example of cell currents of memory cells programmed at two levels; data 1 and data 2. Although FIG. 6 illustrates two-level programming for ease of description, there may be examples of more elaborate programming at various levels, such as four levels or five levels. In the graph 600, the horizontal axis represents the number of memory cells, and the vertical axis represents cell current. Referring to the graph 600, a first data group 610 may correspond to memory cells programmed in a typical previous method, and a second data group 620 may correspond to memory cells programmed in a method of the examples herein. The first data group 610 has a wide dispersal feature, and the second data group 620 has a narrow dispersal feature due to stepwise programming using multiple factors. Therefore, it can be seen that the reliability of in-memory computing may be improved by the methods of the examples herein.

Figure 7:
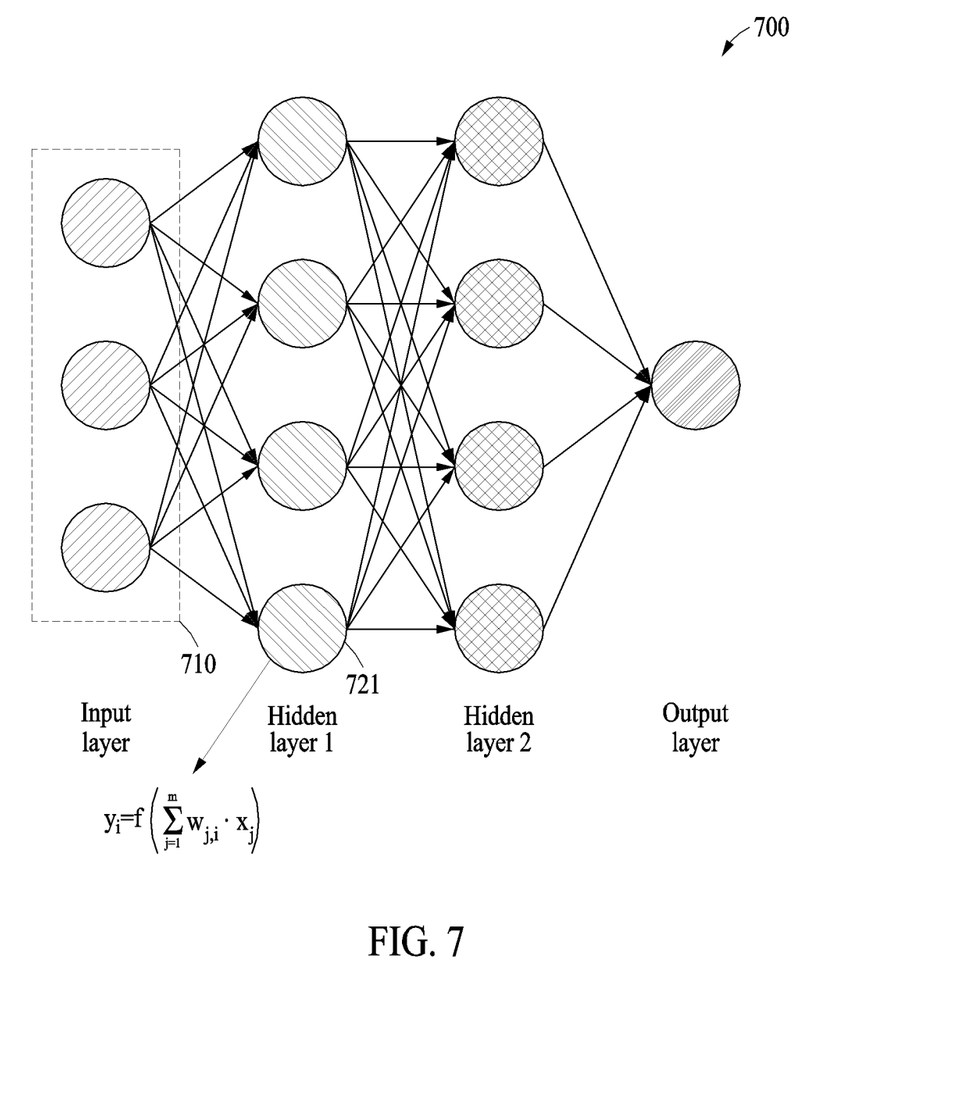
FIG. 7 illustrates an example of a neural network operation that may be implemented through a flash memory device, according to one or more embodiments.

FIG. 7 illustrates an example of a neural network operation that may be implemented through a flash memory device, according to one or more embodiments. A neural network model 700 may be an example of a deep neural network (DNN) having multiple hidden layers. The DNN may include a fully connected network, a deep convolutional network, a recurrent neural network, etc. The neural network model 700 may perform object classification, object recognition, speech recognition, or image recognition by mapping input data and output data to each other based on deep learning (e.g., where the input and output data may be non-linearly related). Deep learning is a machine learning technique for generating such a DNN for solving problems (such as image or speech recognition) using a large amount of data to map input data and output data to each other through supervised or unsupervised learning.

Although FIG. 7 includes two hidden layers for ease of description, various numbers of hidden layers may be included. In addition, although the neural network 700 is illustrated in FIG. 7 as including a separate input layer 710 to receive input data, the input data may be inputted directly to a hidden layer. In the neural network 700, artificial nodes of layers, excluding the output layer, may be connected to artificial nodes of a subsequent layer through connections (e.g., weighted connections) for transmitting output signals. The number of connections from one layer may correspond to the number of artificial nodes included in a subsequent layer.

The outputs of artificial nodes included in a previous layer may be input to the respective artificial nodes included in another hidden layer in a weighted form (e.g., through such weighted connections). The inputs in the weighted form may be referred to as weighted inputs, which are obtained by multiplying respective weights by one or more outputs of the artificial nodes included in the previous layer. Each weight may be referred to as a parameter of the neural network model 700. An activation function may be applied to the sum of the weighted inputs and output to the subsequent layer. The activation function may include sigmoid, hyperbolic tangent (tanh) and rectified linear unit (ReLU) and may form nonlinearity in the neural network 700. The weighted inputs, or the weighted form of the outputs of the artificial nodes included in the previous layer, may be input to the respective artificial nodes included in the output layer. As such, various operations related to the neural network model 700 may be referred to as a network operation.

The flash memory device may be used to implement the deep learning or the trained DNN algorithm through the network operation. For example, the calculation of the weighted inputs transmitted between nodes of the neural network model 700 may include a MAC operation that repeats multiplication and accumulation, e.g., prior to each activation function at each node. An output of a predetermined node, for example, an ith node 721, of the neural network model 700 may be represented by the following Equation.

$$y_i = f\left(\sum_{j=1}^{m} w_{j,i} x_j\right)$$

The above Equation may represent an output value $y_i$ of the ith node 721 on m weighted input values in a predetermined layer. Variable $x_j$ denotes a jth output value (e.g., a node value) of a previous layer, and $w_{j,i}$ denotes a weight applied to the jth output value of the previous layer and the ith node 721. The term $w_{j,i} x_j$ denotes a jth weighted input of m weighted input values in the ith node 721 of the layer, and f( ) denotes an activation function. As represented in the Equation, a MAC result of the node value $x_j$ and the weight $w_{j,i}$ may be used for the activation function. In other words, a memory access operation for loading an appropriate node value (e.g., the node value x) and an appropriate weight (e.g., the weight $w_{j,i}$) at a desired time instant and a MAC operation for multiplying and accumulating these node value and weight may be repeated.

In an example, memory cells of a flash memory device may be programmed based on a network parameter (e.g., a weight) of the neural network model 700. A programming target of coarse programming and/or fine programming may be set based on the network parameter. The programming target may include a target range based on a threshold voltage and/or a cell current. Therefore, the examples of the flash memory device described herein may perform some of the operations needed to execute the neural network model 700.

In an example, multi factor-based programming may be used in a training process of the neural network model 700. In an inference process, a network operation may be performed in a form of in-memory computing using pre-programmed memory cells representing values of the network parameter. In examples herein, compared to programming time in a typical ISPP method, programming time may be longer because of multiple factors and coarse/fine programming operations, but programming accuracy beneficial for in-memory computing may be provided.

Applications of these examples of a flash memory device are not limited to the example of FIG. 7, and the flash memory device may be applied to an operation for rapidly processing a plurality of pieces of input data by using an analog circuit feature at low power.

Figure 8:
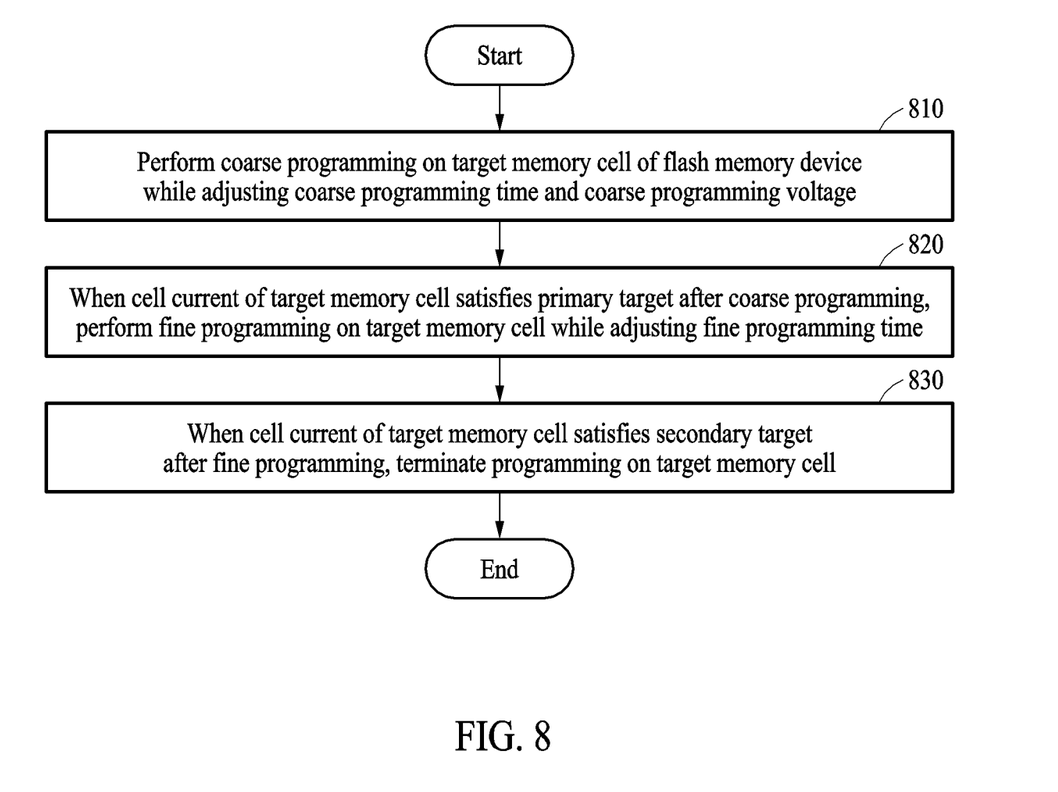
FIG. 8 illustrates an example of controlling a flash memory device, according to one or more embodiments.

FIG. 8 illustrates an example of controlling a flash memory device, according to one or more embodiments. Referring to FIG. 8, in operation 810, the flash memory device may perform coarse programming on a target memory cell of the flash memory device while adjusting coarse programming time and coarse programming voltage. When a cell current of the target memory cell does not satisfy a primary target, even when increasing the coarse programming time to a maximum value, the flash memory device may perform the coarse programming while increasing the coarse programming voltage. The cell current of the target memory cell may vary more when adjusting the coarse programming voltage rather than when adjusting the coarse programming time. A variation range may vary based on a programming voltage adjustment.

The flash memory device may determine the variation of the cell current of the target memory cell based on the coarse programming. When the variation of the cell current is greater than an upper limit of a primary target range, the flash memory device may decrease the coarse programming time, and when the variation of the cell current is less than a lower limit of the primary target range, the flash memory device may increase the coarse programming time or the coarse programming voltage. When the coarse programming time corresponds to the maximum value, the flash memory device may increase the coarse programming voltage.

In operation 820, when the cell current of the target memory cell satisfies the primary target after the coarse programming, the flash memory device may perform fine programming on the target memory cell while adjusting fine programming time. The flash memory device may determine the variation of the cell current of the target memory cell based on the fine programming. When the variation of the cell current is greater than an upper limit of a secondary target range, the flash memory device may decrease the fine programming time, and when the variation of the cell current is less than a lower limit of the secondary target range, the flash memory device may increase the fine programming time.

In operation 830, when the cell current of the target memory cell satisfies the secondary target after the fine programming, the flash memory device may terminate programming on the target memory cell. The primary target range may be greater than the secondary target range. At least a portion of the primary target and the secondary target may be set based on a network parameter of a neural network model, and a network operation of the neural network model may be performed through the target memory cell. The network operation may include a MAC operation.

Figure 9:
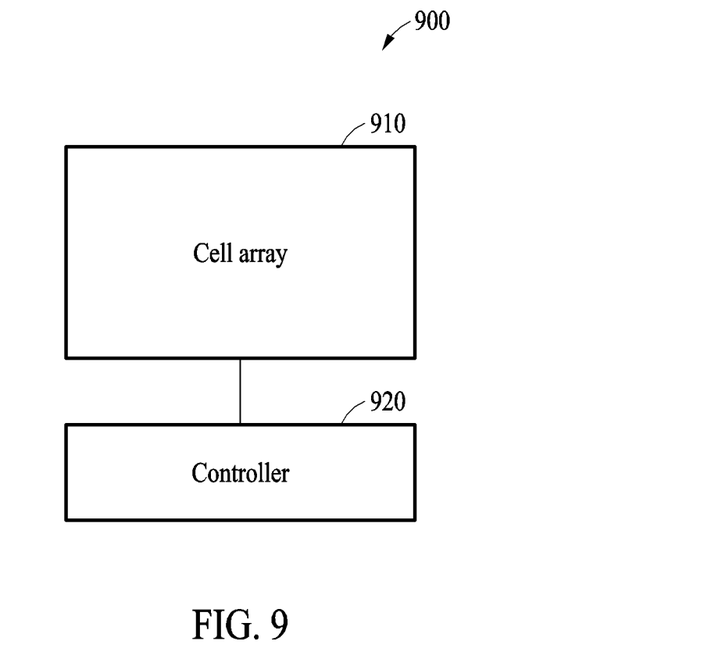
FIG. 9 illustrates an example of a flash memory device, according to one or more embodiments.

FIG. 9 illustrates an example of a configuration of a flash memory device, according to one or more embodiments. Referring to FIG. 9, a flash memory device 900 may include a cell array 910 and a controller 920. The cell array 910 may include a plurality of memory cells, and the controller 920 may also be representative of the controller 920 including a processor. The controller 920 may perform coarse programming on a target memory cell of a flash memory while adjusting coarse programming time and/or coarse programming voltage; when a cell current of the target memory cell satisfies a primary target after the coarse programming, perform fine programming on the target memory cell while adjusting fine programming time; and when the cell current of the target memory cell satisfies a secondary target after the fine programming, terminate programming on the target memory cell. In addition, the description provided with reference to FIGS. 1 through 8 and 10 may apply to the flash memory device 900.

Figure 10:
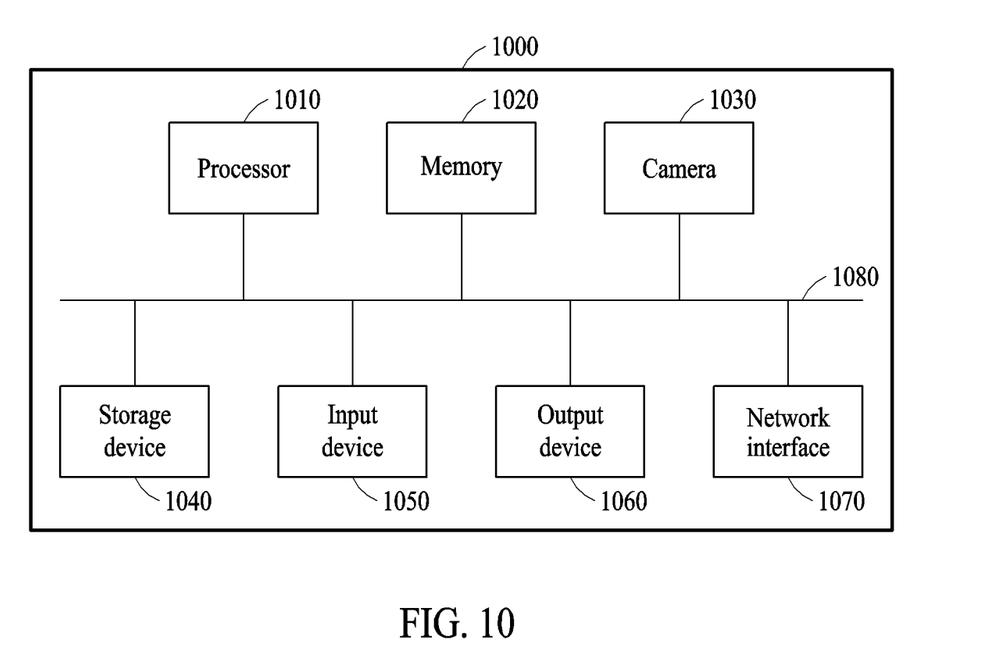
FIG. 10 illustrates an example of an electronic apparatus, according to one or more embodiments.

FIG. 10 illustrates an example of a configuration of an electronic apparatus, according to one or more embodiments. Referring to FIG. 10, an electronic apparatus 1000 may include a processor 1010, a memory 1020, a camera 1030, a storage device 1040, an input device 1050, an output device 1060, and a network interface 1070, and these components may communicate with one another through a communication bus 1080. For example, the electronic apparatus 1000 may be implemented as, or as at least a part of, a mobile device, such as a mobile phone, a smartphone, a personal digital assistant (PDA), a netbook, a tablet computer or a laptop computer, a wearable device, such as a smart watch, a smart band or smart glasses, a computing device, such as a desktop or a server, a home appliance, such as a television, a smart television or a refrigerator, a security device, such as a door lock, or a vehicle, such as an autonomous vehicle or a smart vehicle. The electronic apparatus 1000 may structurally and/or functionally include the flash memory device 900. For example, the flash memory device 900 may be implemented as a part of the processor 1010 and/or the memory 1020, or as a part of an accelerator of the electronic apparatus 1000, e.g., represented by an additional processor 1010.

The processor 1010 executes functions and instructions to be executed by the electronic apparatus 1000. For example, the processor 1010 may process commands stored in the memory 1020 or the storage device 1040. The processor 1010 may perform one or more of the operations described above with reference to FIGS. 1 through 9. The memory 1020 may include a non-transitory computer-readable storage medium or device. The memory 1020 may store instructions to be executed by the processor 1010, to configure the processor to implement any one, any combination, as all operations and/or methods described herein and may store related information while software and/or an application is executed by the electronic apparatus 1000. In an example, the memory 1020 may include a flash memory.

The camera 1030 may capture a photo and/or record a video. The storage device 1040 includes a non-transitory computer-readable storage medium or computer-readable storage device. The storage device 1040 may store a greater amount of information than the memory 1020 and may store the information for a long period of time. The storage device 1040 may include, for example, a magnetic hard disk, an optical disc, a flash memory, a floppy disk, and other types of non-volatile memory devices well known in the related technical fields.

The input device 1050 may receive an input from a user by a traditional input method through a keyboard and a mouse, or by a new input method through a touch input, a voice input, and an image input. The input device 1050 may include, for example, a keyboard, a mouse, a touchscreen, a microphone, and any other device that detects an input from a user and transmits the detected input to the electronic apparatus 1000. The output device 1060 may provide an output of the electronic apparatus 1000 to a user through a visual, auditory, or tactile channel. The output device 1060 may include, for example, a display, a touchscreen, a speaker, a vibration generation device, and any other device that provides an output to a user. The network interface 1070 may communicate with an external device through a wired or wireless network.

The examples described herein are implemented using hardware components or hardware components and instructions executable by any such hardware components. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

Software may include a computer program, a piece of code, an instruction, or some combination thereof, to independently or collectively instruct or configure the processing device (e.g., the controller 920) to operate as desired. Software and/or data may be embodied permanently or temporarily in any type of machine, component, physical or virtual equipment, computer storage medium or device, or in a propagated signal wave capable of providing instructions or data to or being interpreted by the processing device. The software also may be distributed over network-coupled computer systems so that the software is stored and executed in a distributed fashion. The software and data may be stored by one or more non-transitory computer-readable recording mediums.

The methods according to the above-described examples may be recorded in non-transitory computer-readable media including program instructions to implement various operations of the above-described examples. The media may also include, alone or in combination with the program instructions, data files, data structures, and the like. The program instructions recorded on the media may be those specially designed and constructed for the purposes of examples, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher-level code that may be executed by the computer using an interpreter. The above-described hardware devices may be configured to act as one or more software modules in order to perform the operations of the above-described examples, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A method comprising:
performing iterations of first programming on a target memory cell of a cell array until a primary target of the first programming is determined to be satisfied, wherein each iteration of the first programming includes applying a programming voltage to the target memory cell for a first programming time and determining whether a corresponding current of the target cell satisfies a primary target, wherein first of the iterations adjust only the first programming time until the programming time reaches a threshold value, and wherein second of the iterations adjust only the programming voltage after the programming time reaches the threshold value;
when the cell current of the target memory cell is determined to satisfy the primary target of the first programming, performing second programming on the target memory cell by iteratively adjusting a second programming time; and
when the cell current of the target memory cell is determined to satisfy a secondary target in association with the second programming, terminating programming on the target memory cell.

2. The method of claim 1, wherein
the cell current of the target memory cell varies more when adjusting the programming voltage than when adjusting the first programming time.

3. The method of claim 1, wherein
the performing of the first programming comprises:
determining a variation of the cell current of the target memory cell based on the first programming;
when the variation of the cell current is determined to be greater than an upper limit of a primary target range, decreasing the first programming time; and
when the variation of the cell current is determined to be less than a lower limit of the primary target range, increasing the first programming time or the programming voltage.

4. The method of claim 3, wherein
the increasing of the first programming time or the programming voltage comprises:
when the first programming time is determined to correspond the threshold value, increasing the programming voltage.

5. The method of claim 1, wherein
the performing of the second programming comprises:
determining a variation of the cell current of the target memory cell based on the first programming and the second programming;
when the variation of the cell current is determined to be greater than an upper limit of a secondary target range, decreasing the second programming time; and
when the variation of the cell current is determined to be less than a lower limit of the secondary target range, increasing the second programming time.

6. The method of claim 1, wherein a range of the primary target is greater than a range of the secondary target.

7. The method of claim 1, wherein
at least a portion of the primary target and a portion of the secondary target is set based on a network parameter of a neural network model, and
a network operation of the neural network model is performed using the target memory cell.

8. The method of claim 7, wherein
the network operation comprises a multiply-accumulate (MAC) operation.

9. A non-transitory computer-readable storage medium storing instructions that, when executed by a processor, cause the processor to perform the method of claim 1.

10. A memory device comprising:
a cell array comprising a plurality of memory cells; and
a controller configured to perform iterations of first programming on a target memory cell of the cell array until a primary target of the first programming is determined to be satisfied, wherein each iteration of the first programming includes applying a programming voltage to the target memory cell for a first programming time and determining whether a corresponding current of the target cell satisfies a primary target, wherein first of the iterations adjust only the first programming time until the programming time reaches a threshold value, and wherein second of the iterations adjust only the programming voltage after the programming time reaches the threshold value, wherein
when the cell current of the target memory cell is determined to satisfy the primary target of the first programming, the controller performs second programming on the target memory cell by iteratively adjusting second programming time, and
when the cell current of the target memory cell is determined to satisfy a secondary target in association with the second programming, terminate programming on the target memory cell.

11. The memory device of claim 10, wherein the cell current of the target memory cell varies more when adjusting the programming voltage rather than when adjusting the first programming time.

12. The memory device of claim 10, wherein
the controller is configured to:
determine a variation of the cell current of the target memory cell based on the first programming,
when the variation of the cell current is determined to be greater than an upper limit of a primary target range, decrease the first programming time, and
when the variation of the cell current is determined to be less than a lower limit of the primary target range, increase the first programming time or the programming voltage.

13. The memory device of claim 12, wherein
the controller is configured to:
when the first programming time corresponds to the threshold value, increase the programming voltage.

14. The memory device of claim 10, wherein
the controller is configured to:
determine a variation of the cell current of the target memory cell based on the first programming and the second programming,
when the variation of the cell current is determined to be greater than an upper limit of a secondary target range, decrease the second programming time, and
when the variation of the cell current is determined to be less than a lower limit of the secondary target range, increase the second programming time.

15. The memory device of claim 10, wherein
at least a portion of the primary target and a portion of the secondary target are set based on a network parameter of a neural network model,
a network operation of the neural network model is performed using the target memory cell, and
the network operation comprises a multiply-accumulate (MAC) operation.

16. The memory device of claim 10, wherein the device is a smart phone.

17. A memory device comprising:
memory storing instructions;
a flash memory comprising a plurality of memory cells;
a processor configured by the instructions to perform iterations of first programming on a target memory cell of the flash memory until a primary target of the first programming is determined to be satisfied, wherein each iteration of the first programming includes applying a programming voltage to the target memory cell for a first programming time and determining whether a corresponding current of the target cell satisfies a primary target, wherein first of the iterations adjust only the first programming time until the programming time reaches a threshold value, and wherein second of the iterations adjust only the programming voltage after the programming time reaches the threshold value,
when the cell current of the target memory cell is determined to satisfy the primary target of the first programming, perform second programming on the target memory cell by iteratively adjusting a second programming time, and
when the cell current of the target memory cell is determined to satisfy a secondary target after the second programming, terminate programming on the target memory cell.

18. The memory device of claim 17, wherein, during the second programming, the second programming time changes in smaller increments than the second programming does during the first programming.

19. The memory device of claim 17, wherein
the processor is further configured to:
determine a variation of the cell current of the target memory cell based on the first programming,
when the variation of the cell current is determined to be greater than an upper limit of a primary target range, decrease the first programming time,
when the variation of the cell current is determined to be less than a lower limit of the primary target range, increase the first programming time or the programming voltage, and when the first programming time is determined to correspond to the threshold value, increase the programming voltage.

20. A method comprising:

repeatedly adjusting a programming voltage of a memory cell of a flash memory device until it is determined that a cell current of the memory cell has reached a first threshold; and based on determining that the cell current has reached the first threshold, repeatedly adjusting a programming time of the memory cell until it is determined that the cell current of the memory cell has reached a second threshold, wherein the repeatedly adjusting the programming voltage further comprises adjusting the programming time of the programming voltage, and wherein the programming time is adjusted with greater granularity before determining that the cell current has reached the first threshold than when adjusted after determining that the cell current has reached the first threshold.

21. The method of claim 20, wherein the programming voltage is not adjusted while adjusting the programming time after the cell current has been determined to have reached the first threshold.

\* \* \* \* \*